(12) United States Patent
Putkonen

(10) Patent No.: US 7,351,658 B2
(45) Date of Patent: *Apr. 1, 2008

(54) PROCESS FOR PRODUCING YTTRIUM OXIDE THIN FILMS

(76) Inventor: Matti Putkonen, Kivipadontie 6 A 7, FIN-00640, Helsinki (FI)

( * ) Notice: Subject to any disclaimer, the term of this patent is extended or adjusted under 35 U.S.C. 154(b) by 32 days.

This patent is subject to a terminal disclaimer.

(21) Appl. No.: 10/917,906

(22) Filed: Aug. 13, 2004

(65) Prior Publication Data

US 2005/0020092 A1 Jan. 27, 2005

(51) Int. Cl.
*H01L 21/443* (2006.01)
*C23C 16/40* (2006.01)
*C23C 16/18* (2006.01)

(52) U.S. Cl. .................. 438/681; 438/778; 427/255.31

(58) Field of Classification Search ............. 438/3, 438/680, 681, 685, 761, 778, 785; 427/255.28, 427/255.31
See application file for complete search history.

(56) References Cited

U.S. PATENT DOCUMENTS

| | | | |
|---|---|---|---|
| 4,058,430 A | 11/1977 | Suntola et al. | |
| 4,927,670 A | 5/1990 | Erbil | |
| 5,173,474 A | 12/1992 | Connell | |
| 5,314,759 A * | 5/1994 | Harkonen et al. | 428/690 |
| 5,447,909 A * | 9/1995 | Takahashi et al. | 505/447 |
| 5,496,597 A * | 3/1996 | Soininen et al. | 427/584 |
| 5,711,811 A | 1/1998 | Suntola et al. | |
| 5,912,068 A | 6/1999 | Jia | |
| 5,923,056 A * | 7/1999 | Lee et al. | 257/192 |
| 6,060,755 A | 5/2000 | Ma et al. | |
| 6,203,613 B1 | 3/2001 | Gates et al. | |
| 6,207,589 B1 | 3/2001 | Ma et al. | |
| 6,248,605 B1 | 6/2001 | Harkonen et al. | |
| 6,265,222 B1 * | 7/2001 | DiMeo et al. | 436/144 |
| 6,297,539 B1 | 10/2001 | Ma et al. | |
| 6,383,669 B1 | 5/2002 | Leedham et al. | |
| 6,407,435 B1 | 6/2002 | Ma et al. | |
| 6,548,424 B2 | 4/2003 | Putknonen | |
| 6,858,546 B2 * | 2/2005 | Niinisto et al. | 438/785 |
| 2003/0072882 A1 * | 4/2003 | Niinisto et al. | 427/255.28 |

FOREIGN PATENT DOCUMENTS

| | | |
|---|---|---|
| EP | 0 387 892 | 9/1990 |
| FI | 105313 | 12/1999 |

(Continued)

OTHER PUBLICATIONS

Kawai et al. (64-027131); Jan. 1989 (English Abstract).*

(Continued)

*Primary Examiner*—M. Wilczewski
(74) *Attorney, Agent, or Firm*—Knobbe, Martens, Olson & Bear, LLP

(57) ABSTRACT

This invention concerns a process for producing oxide thin film on a substrate by an ALD type process. According to the process, alternating vapour-phase pulses of at least one metal source material, and at least one oxygen source material are fed into a reaction space and contacted with the substrate. According to the invention, an yttrium source material and a zirconium source material are alternately used as the metal source material so as to form an yttrium-stabilised zirconium oxide (YSZ) thin film on a substrate.

17 Claims, 8 Drawing Sheets

FOREIGN PATENT DOCUMENTS

| | | | |
|---|---|---|---|
| FI | 981959 | | 3/2000 |
| JP | 63015442 | | 1/1988 |
| JP | 64-027131 | * | 1/1989 |
| WO | WO 00/15865 | | 3/2000 |

OTHER PUBLICATIONS

Garcia et al., "Preparation of YSZ layers by MOCVD: influence of experimental parameters on the morphology of the films," *Journal of Crystal Growth*, vol. 156, (1995), pp. 426-432.

Matthée et al., "Orientation relationships of epitaxial oxide buffer layers on silicon (100) for high-temperature superconducting Yba2Cu3O7-x films," *Appl. Phys. Lett.*, vol. 61, No. 10, (1992), pp. 1240-1242.

Mölsä et al., "Growth of Yttrium Oxide Thin Films from β-Diketonate Precursor," *Advanced Materials for Optics and Electronics*, vol. 4, (1994), pp. 389-400.

Ritala et al., "Zirconium dioxide thin films deposited by ALE using zirconium tetrachloride as precursor," *Applied Surface Science*, vol. 75, (1994), pp. 333-340.

* cited by examiner

PROCESS FOR PRODUCING YTTRIUM OXIDE THIN FILMS

BACKGROUND OF THE INVENTION

1. Field of the Invention

The present invention relates to oxide thin films produced by an ALD method. In particular, the present invention relates to yttrium-stabilised zirconium oxide (YSZ) thin films.

2. Description of Related Art

The continuous decrease in the size of microelectronic components leads to the situation in which $SiO_2$ used today as the gate oxide in metal oxide semiconductor field effect transitions (MOSEFT) must be replaced with a higher permittivity oxide. This is due to the fact that in order to achieve the required capacitances, the $SiO_2$ layer should be made so thin that the tunneling current would increase to a level affecting the functioning of the component. This problem can be solved by using a dielectric material having a higher dielectric constant than $SiO_2$. For example, the capacitance of dynamic random access memory (DRAM) capacitors must remain nearly constant while their size decreases rapidly, and thus it is necessary to replace the previously used $SiO_2$ and $Si_3N_4$ with materials which have higher permittivities than these and give higher capacitance density.

There is a number of materials exhibiting sufficiently high dielectric constant, but in addition to high permittivities, these dielectric thin films are required to have, among other things, low leakage current densities and high dielectric breakdown fields. The achievement of both of these properties presupposes a dense and flawless film structure. It is also important that the materials are stable in contact with silicon and can be exposed to the high post-treatment temperatures essentially without changes. Especially in the gate oxide application it is important that in the interface between silicon and the metal oxide having high dielectric constant there are very few electrically active states. In the memory application it is important that the structure of the dielectric of the capacitor is stable, since the temperatures used for activation of implanted ions are high.

Zirconium oxide, $ZrO_2$ is an insulating material having a high melting point and good chemical stability. $ZrO_2$ can be further stabilised by adding other oxides, the aim of adding other oxides is to eliminate the phase changes of $ZrO_2$. Normally, the monoclinic crystal form is stable up to 1100° C. and tetragonal up to 2285° C., above which the cubic form is stable. The stabilisation is typically carried out by adding yttrium oxide ($Y_2O_3$), but also MgO, CaO, $CeO_2$, $In_2O_3$, $Gd_2O_3$, and $Al_2O_3$ have been used. Previously, YSZ thin film layers have been produced, for example, by metal-organic chemical vapour deposition (MOCVD) (Garcia, G. et al., Preparation of YSZ layers by MOCVD: Influence of experimental parameters on the morphology of the film, *J. Crystal Growth* 156 (1995), 426) and e-beam evaporation techniques (cf. Matthée, Th. et al., Orientation relationships of epitaxial oxide buffer layers on silicon (100) for high-temperature superconducting $YBa_2Cu_3O_{7-x}$ films, *Appl. Phys. Lett.* 61 (1992), 1240).

Atomic layer deposition (ALD) can be used for producing binary oxide thin films. ALD, which originally was known as atomic layer epitaxy (ALE) is a variant of traditional CVD. The method name was recently changed from ALE into ALD to avoid possible confusion when discussing about polycrystalline and amorphous thin films. Equipment for ALD is supplied under the name ALCVD™ by ASM Microchemistry Oy, Espoo, Finland. The ALD method is based on sequential self-saturating surface reactions. The method is described in detail in U.S. Pat. Nos. 4,058,430 and 5,711,811. The growth benefits from the usage of inert carrier and purging gases which makes the system faster.

When ALD type process is used for producing more complicated compounds, all components may not have, at the same reaction temperature range, an ALD process window, in which the growth is controlled. Mölsä et al. have discovered that an ALD type growth can be obtained when growing binary compounds even if a real ALD window has not been found, but the growth rate of the thin film depends on the temperature (Mölsä, H. et al., *Adv. Mat. Opt. El.* 4 (1994), 389). The use of such a source material and reaction temperature for the production of solid solutions and doped thin films may be found difficult when a precise concentration control is desired. Also the scaling of the process becomes more difficult, if small temperature changes have an effect on the growth process.

Mölsä et al. (Mölsä, H. et al., *Adv. Mat. Opt. El.* 4 (1994), 389) disclosed a process for growing $Y_2O_3$ by ALE-method. They used $Y(thd)_3$ (thd=2,2,6,6-tetramethyl-3,5-heptanedione) as the yttrium source material and ozone-oxygen mixture as the oxygen source material in a temperature range of 400-500° C. As already discussed, no ALE window could be found since the growth rate increased steadily from 0.3 Å/cycle to 1.8 Å/cycle with increasing temperature.

Ritala et al. (Ritala, M. and Leskelä, M., *Appl. Surf Sci.* 75 (1994), 333) have disclosed a process for growing $ZrO_2$ by an AID type process. $ZrCl_4$ was used as the zirconium source material and water was used as the oxygen source material. The temperature in the process was 500° C. and the growth rate was 0.53 Å/cycle.

SUMMARY OF THE INVENTION

It is an object of the present invention to eliminate the problems of prior art and to provide a novel process for producing yttrium-stabilised zirconium oxide (YSZ) thin films.

This and other objects together with the advantages thereof are achieved by the present invention as hereinafter described and claimed.

The present invention is based on the finding that yttrium oxide and zirconium oxide can be grown by an ALD type method so that the film growth is in accordance with the principles of ALD so as to form an yttrium-stabilised zirconium oxide thin film.

More specifically, the process for producing YSZ thin films is characterised by what is stated in the characterising part of claim 1.

A number of considerable advantages are achieved by means of the present invention.

The growth rate of the yttrium-stabilised zirconium oxide thin film is high, e.g., the growth rate of ALD thin film was approximately 25% higher than would be expected based on the growth rates of $ZrO_2$ and $Y_2O_3$.

The temperatures used in the present invention are low compared with the processes of prior art, which reduces the cost of the production process.

A film grown with the present process exhibits good thin film properties. Thus, the oxide films obtained have an excellent conformality even on uneven surfaces. The method also provides an excellent and automatic self-control for the film growth.

The ALD grown yttrium-stabilised zirconium oxide thin films can be used, for example, as insulators in electronics and optics. For example, in field emission displays (FED) it is preferred that insulating oxides which have a smooth surface, are used. It is also possible to use the YSZ thin films as solid electrolytes in gas sensors and fuel cells. Particularly suitably the YSZ thin films are used as gate oxides in microelectronic devices, and as capacitor in dynamic random access memory (DRAM).

Next, the invention is described in detail with the aid of the following detailed description and by reference to the attached drawings.

DETAILED DESCRIPTION OF THE INVENTION

Definitions

Figure 1:
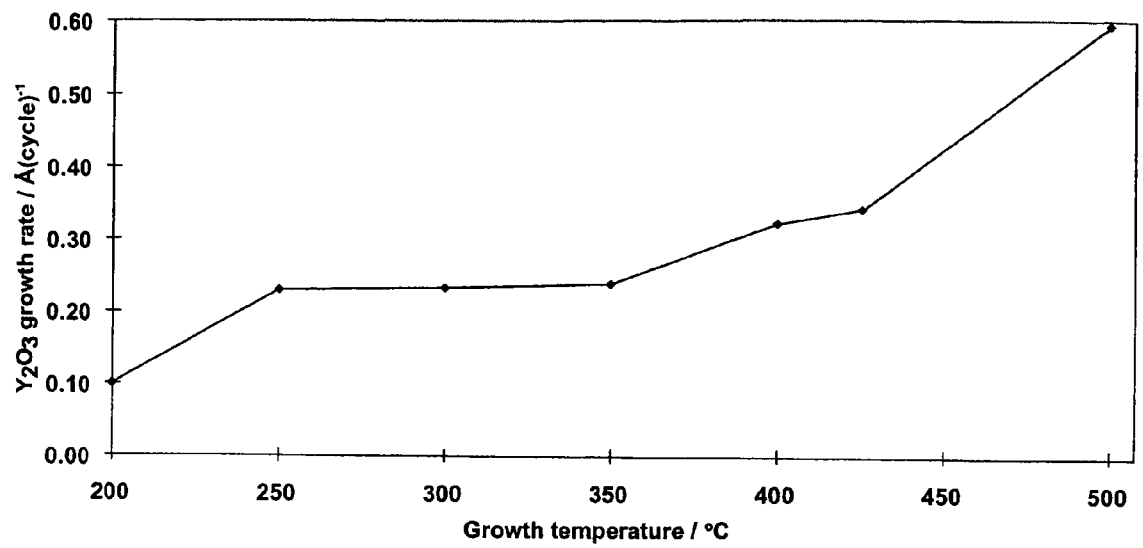
FIG. 1 presents the growth rate of $Y_2O_3$ as a function of the growth temperature.

For the purposes of the present invention, an "ALD-type process" designates a process in 10 which growth of material from gaseous or vaporized source chemicals onto a surface is based on sequential and alternating self-saturating surface reactions. The principles of ALD are disclosed, e.g., in U.S. Pat. Nos. 4,058,430 and 5,711,811.

"Reaction space" is used to designate a reactor or reaction chamber in which the conditions can be adjusted so that growth by ALD is possible.

"ALD window" is used to designate the temperature range in which the growth of a thin film takes place according to the principles of ALD. One indication of thin film growing according to the ALD principles is the fact that the growth rate remains essentially constant over the temperature range.

"Thin film" is used to designate a film which is grown from elements or compounds that are transported as separate ions, atoms or molecules via vacuum, gaseous phase or liquid phase from the source to the substrate. The thickness of the film depends on the application and it varies in a wide range, e.g., from one molecular layer to 800 nm or up to 1 μm or even over that.

The Growth Process

According to the present invention, the oxide thin films are produced by an ALD method. Thus, a substrate placed in a reaction chamber is subjected to sequential, alternately repeated surface reactions of at least two vapor-phase reagents for the purpose of growing a thin film thereon.

The conditions in the reaction space are adjusted so that no gas-phase reactions, i.e., reactions between gaseous reagents, occur, only surface reactions, i.e., reactions between species adsorbed on the surface of the substrate and a gaseous reagent. Thus, the molecules of oxygen source material react with the adsorbed metal source compound layer on the surface. This kind of growth is in accordance with the principles of ALD.

According to the present process the vapour-phase pulses of the metal source material and the oxygen source material are alternately and sequentially fed to the reaction space and contacted with the surface of the substrate fitted into the reaction space. The "surface" of the substrate comprises initially the surface of the actual substrate material which optionally has been pre-treated in advance, e.g., by contacting it with a chemical for modifying the surface properties thereof. During the growth process of the thin films, the previous metal oxide layer forms the surface for the following metal oxide layer. The reagents are preferably fed into the reactor with the aid of an inert carrier gas, such as nitrogen.

Preferably, and to make the process faster, the metal source material pulse and the oxygen source material pulse are separated from each other by an inert gas pulse, also referred to as gas purge in order to purge the reaction space from the unreacted residues of the previous chemical and the reaction products. The inert gas purge typically comprises an inactive gas, such as nitrogen, or a noble gas, such as argon.

Thus, one pulsing sequence (also referred to as a "cycle" or "reaction cycle") preferably consists essentially of
feeding a vapour-phase pulse of a metal source chemical with the help of an inert carrier gas into the reaction space;
purging the reaction space with an inert gas;
feeding a vapour-phase pulse of an oxygen source material into the reaction space; and
purging the reaction space with an inert gas.

The purging time is selected to be long enough to prevent gas phase reactions and to prevent metal oxide thin film growth rates higher than optimum ALD growth rate per cycle for said oxide.

The deposition can be carried out at normal pressure, but it is preferred to operate the method at reduced pressure. The pressure in the reactor is typically 0.01-20 mbar, preferably 0.1-5 mbar.

The substrate temperature has to be low enough to keep the bonds between thin film atoms intact and to prevent thermal decomposition of the gaseous or vaporised reagents. On the other hand, the substrate temperature has to be high enough to keep the source materials in gas phase, i.e., condensation of the gaseous or vaporised reagents must be avoided. Further, the temperature must be sufficiently high to provide the activation energy for the surface reaction.

When growing zirconium oxide on a substrate, the temperature of the substrate is typically 250-500° C., preferably 275-450° C., and in particular 275-325° C. The temperature range used for growing $Y_2O_3$ on a substrate is typically 200-400° C., preferably 250-350° C. The YSZ films are typically grown at 250-400° C., preferably at 275-350° C., and in particular at 275-325° C.

At these conditions, the amount of reagents bound to the surface will be determined by the surface. This phenomenon is called "self-saturation".

Maximum coverage on the substrate surface is obtained when a single layer of metal source chemical molecules is adsorbed. The pulsing sequence is repeated until an oxide film of predetermined thickness is grown.

The source temperature is preferably set below the substrate temperature. This is based on the fact that if the partial pressure of the source chemical vapour exceeds the condensation limit at the substrate temperature, controlled layer-by-layer growth of the film is lost.

The amount of time available for the self-saturating reactions is limited mostly by the economical factors such as required throughput of the product from the reactor. Very thin films are made by relatively few pulsing cycles and in some cases this enables an increase of the source chemical pulse times and, thus, utilization of the source chemicals with a lower vapour pressure than normally.

The substrate can be of various types, for example sheet-formed or powder-like. Examples include silicon, silica, coated silicon, copper metal, and various nitrides, such as metal nitrides.

The YSZ thin films grown according to the process of the present invention are typically (100) oriented.

Chlorine residues can be found in thin films comprising zirconium and/or yttrium, when one or more of the source materials contains chlorine. In the YSZ thin films produced according to the present invention the concentration of Cl in the films is typically 0.05-0.25 wt-%. It was surprisingly found out in the connection of the present invention, that when the concentration of yttrium in the formed film was low, i.e., below 20 wt-%, and in particular below 15 wt-%, the chloride content of the formed thin film was lower than that of a film consisting essentially-of $ZrO_2$.

In the pulsing sequence described above, the metal source chemical is either a zirconium source material or an yttrium source material. Thus, in the growth process of the present invention, yttrium oxide and zirconium oxide are grown on a substrate.

According to a preferred embodiment of the present invention, an yttrium-stabilised zirconium oxide thin film is formed. Thus, during the growth of the thin film, at least one pulsing cycle described above will be carried out using an yttrium source chemical as the metal source chemical, and at least one pulsing cycle described above will be carried out using a zirconium source chemical as the metal source chemical.

The pulsing ratio between yttrium source chemical and zirconium source chemical can be selected so as to obtain the desired properties to the thin film. Typically, the pulsing ratio Y:Zr is from 1:10 to 10:1, preferably from 1:5 to 5:1, more preferably from 1:3 to 3:1, and most preferably the pulsing ratio is approximately 1:1.

Figure 8:
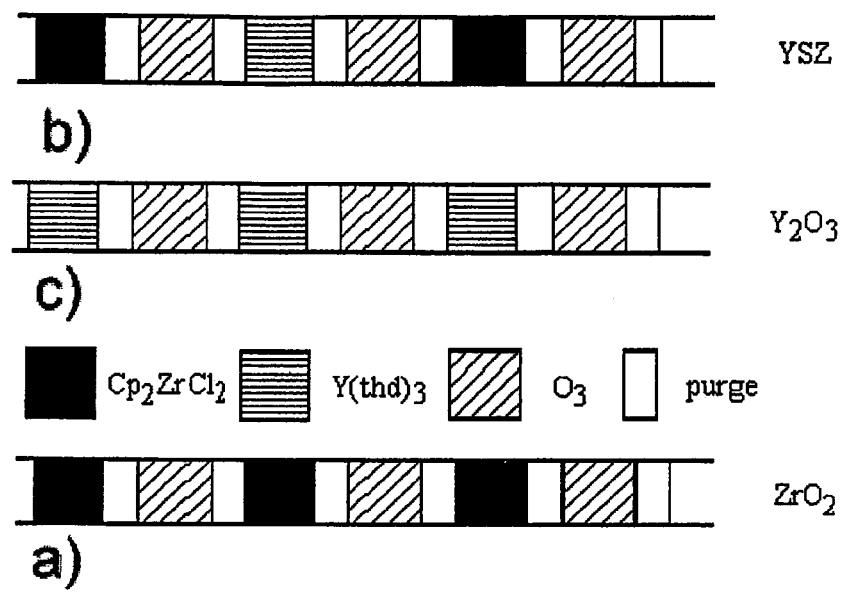
FIG. 8 presents the pulsing sequences of $ZrO_2$, YSZ and $Y_2O_3$ thin films.

FIG. 8 presents pulsing sequences which can be used for growing $ZrO_2$, YSZ and $Y_2O_3$ thin films. In FIG. 8(b) the pulsing sequence for pulsing ratio Y:Zr=1:2 for the YSZ film is depicted.

Figure 9:
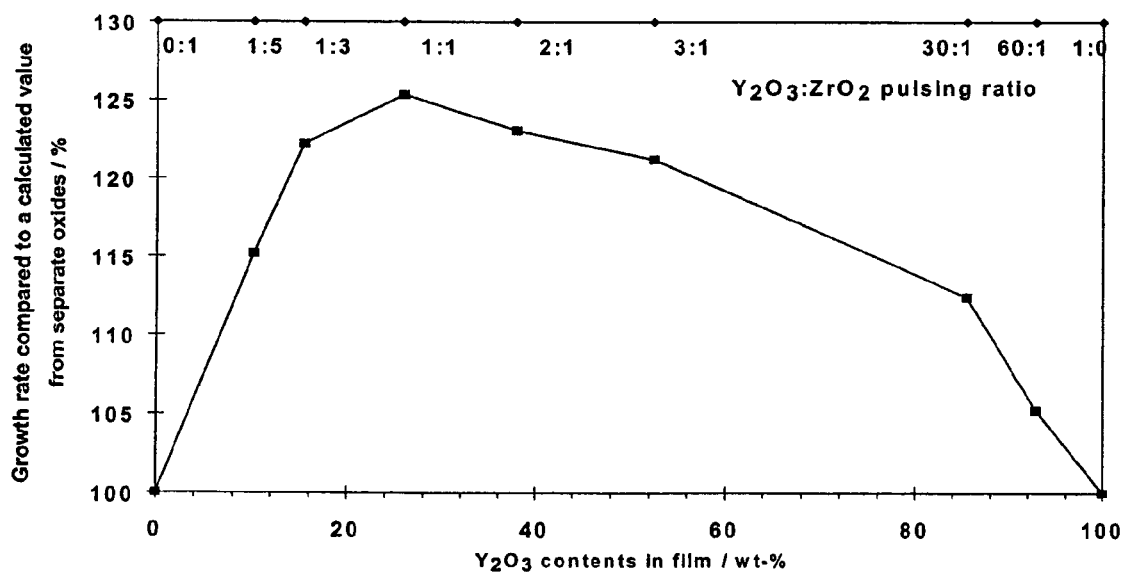
FIG. 9 presents the growth rate of a YSZ thin film as a function of $Y_2O_3$ content in the film.

FIG. 9 presents the growth rate of a YSZ thin film compared to a value calculated for separate oxides as a function of weight percentage of $Y_2O_3$ in the film. The value to which the growth rate of YSZ is compared is calculated by adding together the growth rates of $Y_2O_3$ and $ZrO_2$ at each pulsing ratio of $Y_2O_3$:$ZrO_2$, and this calculated value represents 100% in the figure. Thus, the figure shows which effect the $Y_2O_3$:$ZrO_2$ pulsing ratio has on the growth rate and yttrium concentration of the YSZ thin film.

According to one embodiment of the invention, when growing a YSZ thin film the first pulsing cycle on a substrate is carried out using an yttrium source chemical as the metal source chemical.

According to another embodiment of the invention, when growing a YSZ thin film the first pulsing cycle on a substrate is carried out using a zirconium source material as the metal source chemical.

The Source Materials

Gaseous or volatile compounds of yttrium and zirconium are used as metal source materials in the process of the present invention.

Since the properties of each metal compound vary, the suitability of each metal compound for the use in the process of the present invention has to be considered. The properties of the compounds are found, e.g., in N. N. Greenwood and A. Earnshaw, *Chemistry of the Elements*, $2^{nd}$ edition, Pergamon Press, 1997.

The metal source material has to be chosen so that requirements for sufficient vapour pressure, the sufficient thermal stability at substrate temperature and sufficient reactivity of the compounds are fulfilled.

Sufficient vapour pressure means that there must be enough source chemical molecules in the gas phase near the substrate surface to enable fast enough self-saturating reactions at the surface.

In practice sufficient thermal stability means that the source chemical itself must not form growth-disturbing condensable phases on the substrates or leave harmful levels of impurities on the substrate surface through thermal decomposition. Thus, one aim is to avoid non-controlled condensation of molecules on substrates.

Further selecting criteria may include the availability of the chemical in a high purity, and the easiness of handling, inter al., reasonable precautions.

In addition, the quality of the by-products resulting from the ligand exchange reaction needs to be considered. It is important that the reaction product is essentially gaseous. By this it is meant that the by-products possibly formed in the ligand exchange reaction are gaseous enough to be moved from the reaction space with the aid of the inert purging gas, which means that they will not remain as impurities in the films.

1. Yttrium Source Material

The yttrium source material is typically selected from the group of materials having general formula (I) or (II):

wherein
X is selected from the group of following:
i) diketone coordinated from oxygen (i.e., β-diketonate) of formula (III)

wherein
R' and R" are typically the same and are selected for example from the group of linear or branched $C_1$-$C_{10}$ alkyl groups, in particular linear or branched $C_1$-$C_6$ alkyl groups, and most preferably from the group of —$CH_3$, —$C(CH_3)_3$, —$CF_3$ and —$C(CF_3)_3$,
ii) cyclopentadienyl,
iii) derivative of cyclopentadienyl according to formula (IV):

wherein
R''' is selected for example from the group of linear or branched $C_1$-$C_{10}$ alkyl groups, preferably $C_1$-$C_6$ alkyl groups, in particular methyl (—$CH_3$), ethyl, propyl, butyl, pentyl, and an alkyl having a longer carbon chain, alkoxy, aryl, amino, cyano and silyl group, and y is an integer 1-5, and
B is a neutral adduct ligand, which binds to the center atom from one or more atoms. Typically, B is hydrocarbon, oxygen-containing hydrocarbon (such as ether), nitrogen-containing hydrocarbon (such as bipyridine, phenantroline, amine or polyamine)
According to one embodiment of the present invention, Y(cot)Cp* (cot=cyclo-octatetraenyl and Cp*=pentamethyl cyclopentadienyl) is used as the yttrium source material.
According to a preferred embodiment of the present invention, Y(thd)$_3$ (thd=2,2,6,6-tetramethyl-3,5-heptanedione) is used as the yttrium source material.

2. Zirconium Source Material

The zirconium source material is typically selected from the group of zirconium halides and zirconium compounds comprising at least one carbon atom.
The zirconium source material is typically selected from the group having the general formula (V)

wherein
R is selected from the group of cyclopentadienyl ($C_5H_5$) and its derivatives having the formula (IV).
The ligands R are optionally bridged (—Cp-A-Cp-), wherein A is methyl, an alkyl group of formula ($CH_2$)$_n$, n=2-6, preferably 2 or 3) or a substituted hydrocarbon such as $C(CH_3)_2$.
X is selected from the group of following ligands:
i) halides (F, Cl, Br, I),
ii) hydrogen (—H), linear or branched $C_1$-$C_{10}$ alkyl groups, preferably $C_1$-$C_6$ alkyl groups, in particular methyl (—$CH_3$), ethyl, propyl, butyl or a longer hydrocarbon chain,
iii) methoxy (—$OCH_3$) or other linear (e.g. —$OC_3H_7$) or branched alkoxides,
iv) amines (—$NR_2$), and
v) acetates (—OCOR, e.g. —$OCOCF_3$).

According to one embodiment of the invention, X—ligands are combinations of the compounds identified above. Thus, the zirconium source material is optionally $Cp_2Zr(OR'''')_xCl_{2-x}$ or $Cp_2ZrClH$).
The following preferred combinations of X and R can also be used in the present invention:
X=R=Cl or Br, i.e, compound is a tetrahalide,
X=R=OR", i.e., the compound is a zirconium alkoxide,
X=R=Cp, i.e., the compound is tetracyclopentadienezirconium, and/or
X=R=diketonate, coordinated from oxygen, having a formula (III).
Preferably, the zirconium source material used in the present invention is zirconium tetrachloride ($ZrCl_4$) or dicyclopentadienyl zirconium dichloride ($Cp_2ZrCl_2$).

3. Oxygen Source Material

The oxygen source material may be any oxygen compound usable in the ALE technique. Preferable oxygen source materials include water, oxygen and hydrogen peroxide, and aqueous solutions of hydrogen peroxide. Ozone ($O_3$) is an especially preferable oxygen source material, also as mixture with oxygen ($O_2$). It is known on the basis of the literature that, if ozone is used as the precursor for oxygen, a denser layer of material is obtained from the forming oxides, and thereby the permittivity of the oxide thin film can be improved.
One or more of the following compounds may also be used as the precursor for oxygen:
oxides of nitrogen, such as $N_2O$, NO, and $NO_2$,
halide-oxygen compounds, for example chlorine dioxide ($ClO_2$) and perchloric acid ($HClO_4$),
peracids (—O—O—H), for example perbenzoic acid ($C_6H_5COOOH$) and peracetic acid ($CH_3COOOH$),
alkoxides,
alcohols, such as methanol ($CH_3OH$) and ethanol ($CH_3CH_2OH$), and
various radicals, for example oxygen radical (O.) and hydroxyl radical (.OH).
According to a preferred embodiment of the present invention, a YSZ thin film is grown by an ALD type method using Y(thd)$_3$ as the yttrium source material, dicyclopentadienyl zirconium dichloride ($Cp_2ZrCl_2$) as the zirconium source material and ozone or a mixture of $O_3$ and $O_2$ as the oxygen source material.
According to another preferred embodiment, a YSZ thin film is grown by an ALD type method using Y(thd)$_3$ as the yttrium source material and a mixture of $O_3$ and $O_2$ as the oxygen source material, and zirconium tetrachloride ($ZrCl_4$) as the zirconium source material and water as the oxygen source material.
The following examples illustrate the invention further.

EXAMPLES

Experimental Conditions and Analysis Equipment

In the examples, Y(thd)$_3$ and dicyclopentadienyl zirconium dichloride ($Cp_2ZrCl_2$) (Strem Chemicals) were used as the metal source materials. Y(thd)$_3$ was prepared according to the teaching of Eisentraut and Sievers (Eisentraut, K. J. and Sievers, R. E., J. Am. Chem. Soc. 87 (1965), 5254). The source materials were analysed thermogravimetrically (TG/DTA, Seiko SSC 5200) at a pressure of 1 mbar.
The thin films were grown in MC-120 and F-120 reactors (ASM Microchemistry Oy, Espoo, Finland) and $N_2$ (5.0, Aga) was used as the carrier gas. Ozone, produced with an ozone generator (Fisher 502) from $O_2$ (5.0, Aga), was used as the oxidiser. (100) oriented silicon (Okmetic Oy, Finland) and lime glass were used as substrates. The growing of separate yttrium oxides and zirconium oxides was examined as the function of temperature and the suitability of the source materials was confirmed by experimenting with pulsing times in the range of 0.5-4 seconds.

The crystallinity and orientation of the grown $Y_2O_3$, $ZrO_2$ and YSZ thin films were analysed by X-ray diffraction (XRD, Philips MPD1880, Cu $K_\alpha$). The Y and Zr contents and the possible impurities were determined by X-ray fluoresence (XRF, Philips PW1480) using UniQuant 4.0 software and by Scanning Electron Microscopy with Energy Dispersive X-ray analysis (SEM-EDX) using STRATA software. YSZ thin films were also analysed by X-ray photon spectroscopy (XPS, AXIS 165, Kratos Analytical) using monochromated Al $K_\alpha$ radiation. Both wide scan spectra and HiRes (high resolution) spectra from areas C 1s, O 1s, Zr 3d and Y 3d were determined. The area of the measured sample was approximately 1 mm$^2$, and measurements were carried out from several points.

The thicknesses of the thin films were determined either with Hitachi U-2000 UV-Vis spectrophotometer and with optical fitting method as taught by Ylilammi, M. and Ranta-Aho, T. in *Thin Solid Films* 232 (1993), 56 or by profilometry (the $Y_2O_3$ thin films) (Sloan Dektak SL3030, Veeco Instruments) by etching with a solution of HCl the appropriate steps using a photoresist (AZ 1350H, Hoechst) as a mask.

The thin films were analysed also by Nicolet Magna-IR 750 FT-IR-spectrophotometer using a DTGS detector and a DRIFTS accessory (Spectra Tech Inc.). From the samples prepared on a approximately 0.5×0.5 cm$^2$ (100) silicon substrate mid-IR-area spectra were measured with 2 cm$^{-1}$ resolution and signal-averaging of 64 scans were used. The background was measured with the diffuse alignment mirror of the device (SpectraTech no: 7004-015). The spectra of the silicon wafer with a native oxide was subtracted from the spectra of the samples. The interference in the spectra resulting from water and $CO_2$ residues in the IR apparatus was eliminated by purging with dry air. Smoothing of the measured spectra was carried out when necessary.

Example 1

The Preparation and Analysis of Yttrium Oxide ($Y_2O_3$) Thin Films $Y_2O_3$ thin films-were grown by ALD method at a temperature of 250-350° C. The growth rate of the $Y_2O_3$ thin films was 0.23 Å/cycle.

For $Y_2O_3$ thin film growth from Y(thd)$_3$ an ALD window-was found in which the growth rate remained essentially constant in the temperature range of 250-350° C. The source material temperature was 120° C., the pulsing times were 0.8 s for Y(thd)$_3$ and 3.0 s for $O_3$, and the purging after each source material pulse lasted 1.0 s. This is also presented in FIG. 1, wherein the growth rate of $Y_2O_3$ in Å per cycle is depicted as a function of growth temperature.

Figure 2:
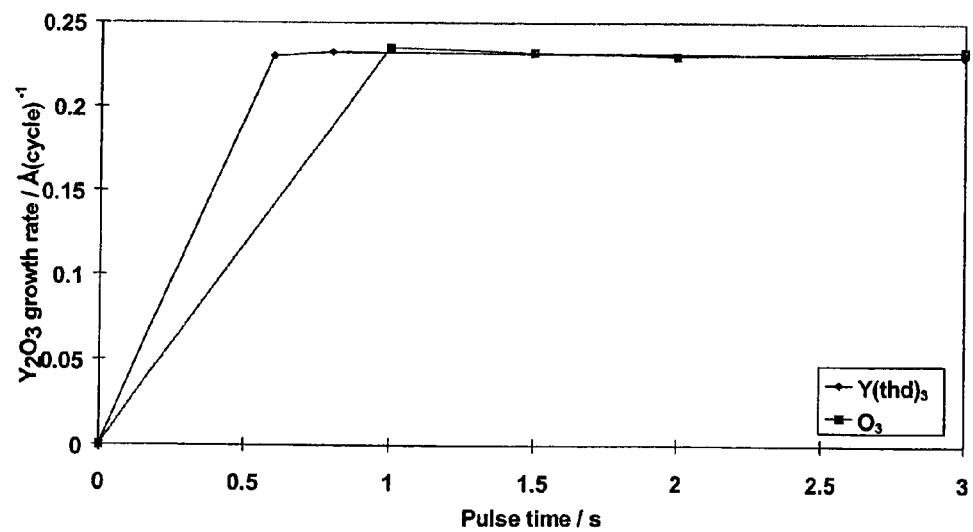
FIG. 2 presents the growth rate of $Y_2O_3$ as a function of the pulse times of the source materials.

FIG. 2 depicts the growth rate of $Y_2O_3$ as Å per cycle as a function of the pulse times of the source materials. The figure shows how the growth rate remains essentially constant when the pulsing time of Y(thd)$_3$ is approximately 0.5 s (during this experiment, the $O_3$ pulse as maintained at 1.5 s) or more and the pulsing time of $O_3$ is approximately 1.0 s or more (during this experiment, the Y(thd)$_3$ pulse was maintained at 0.8 s). The temperature of the yttrium source material was approximately 120° C., and the growth temperature was 300° C. The purging after each source material pulse varied from 0.8 to 2.0 s, increasing with increased pulse time.

Figure 3:
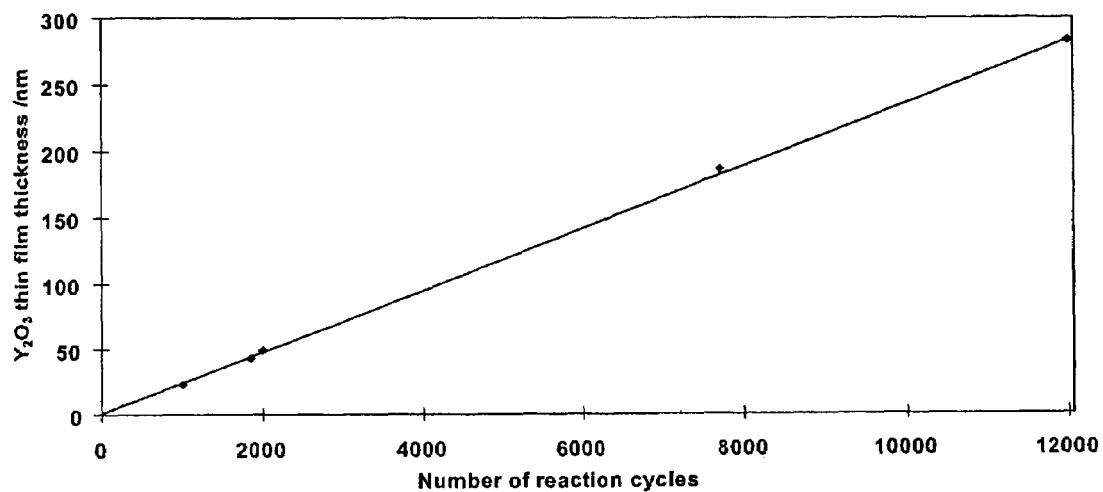
FIG. 3 presents the thickness of a $Y_2O_3$ thin film in nm as a function of the number of reaction cycles.

In FIG. 3 the thickness of a $Y_2O_3$ thin film in nm is presented as a function of the number of reaction cycles. The film was deposited at 300° C., and the temperature of the source material Y(thd)$_3$ was 120° C. The pulse times were 0.8 s for Y(thd)$_3$ and 3.0 s for $O_3$. The purging after each source material pulse lasted 1.0 s. It can be seen from FIG. 3 that the thickness of the film is linearly dependent on the number of growth cycles.

The $Y_2O_3$ films grown in the ALD window of 250-350° C. were (100) oriented. In the films grown at higher temperatures also (111) and (440) orientations were detected. The growth at temperatures higher than 400° C. yielded results similar to those obtained in prior art (Mölsä, H. et al., *Adv. Mat. Opt. El.* 4 (1994), 389). The orientation or crystallinity of the thin films did not vary according to the pulsing times of the source materials.

Example 2

The Preparation and Analysis of Zirconium Oxide ($ZrO_2$) Thin Films

Zirconium oxide thin films were produced using $Cp_2ZrCl_2$ as the zirconium source material. The temperature of the source material was 140° C. The $ZrO_2$ thin films could be grown according to the principles of ALD at temperatures of 275-325° C. and at 400-450° C. In the first range, a growth rate of 0.48 Å/cycle was obtained, and in the second range, the growth rate was 0.53 Å/cycle.

Figure 4:
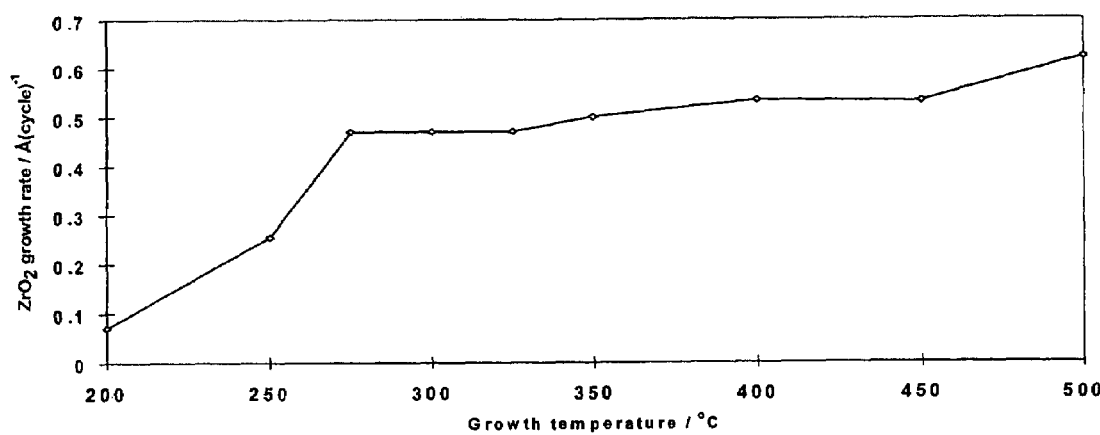
FIG. 4 presents the growth rate of $ZrO_2$ as a function of growth temperature.

This can also be seen in FIG. 4 which presents the growth rate of a $ZrO_2$ thin film as a function of growth temperature. In this experiment, the temperature of the source material $Cp_2ZrCl_2$ was 140-150° C. The pulsing times of $Cp_2ZrCl_2$ and $O_3$ were 0.8 s and 3.0 s, respectively. The purging after each source material pulse lasted 1.0 s.

Figure 5:
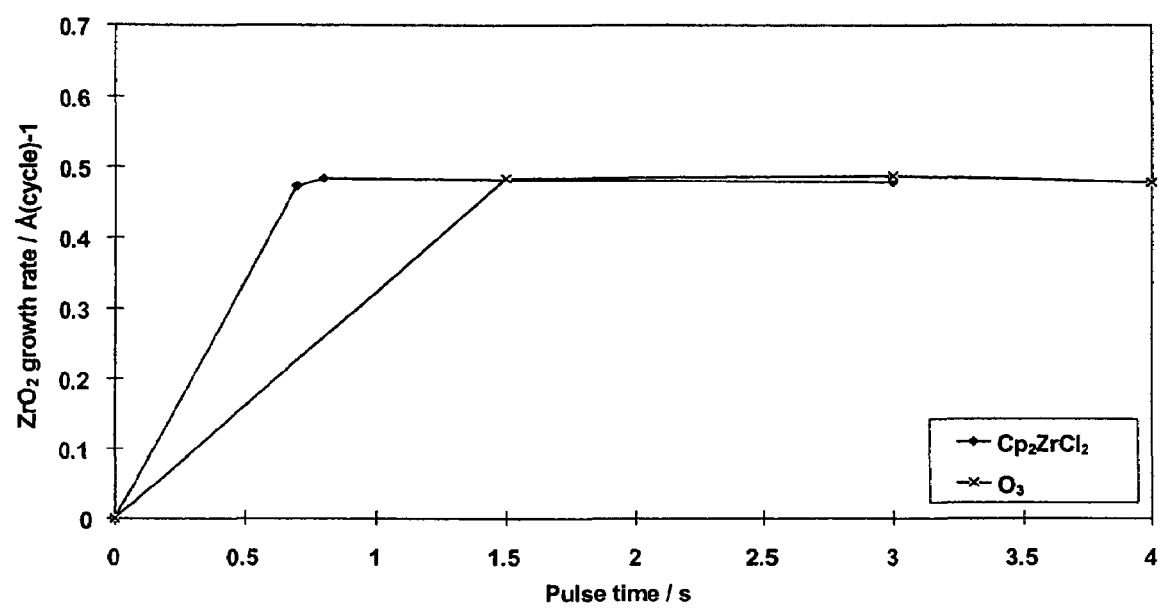
FIG. 5 presents the growth rate of $ZrO_2$ as a function of pulse times.

The pulsing times of the source materials were changed in some experiments. A $Cp_2ZrCl_2$ pulse of 1.0 s saturated the surface of the substrate. An $O_3$ pulse of 1.5 s was needed to complete the reaction cycle. FIG. 5 depicts the growth rate of $ZrO_2$ in Å per cycle as a function of the pulse time. The growth temperature was 300° C. and the temperature of source material $Cp_2ZrCl_2$ was 140-150° C. The purging time was 1.0 s. The figure shows how the growth rate remains essentially constant when the pulsing time of $Cp_2ZrCl_2$ is approximately 0.7 s or more (during these experiments, the pulsing time of $O_3$ was 3.0 s) and the pulsing time of $O_3$ is approximately 1.5 s or more (during these experiments, the pulsing time of $CpZrCl_2$ was 0.8 s).

Figure 6:
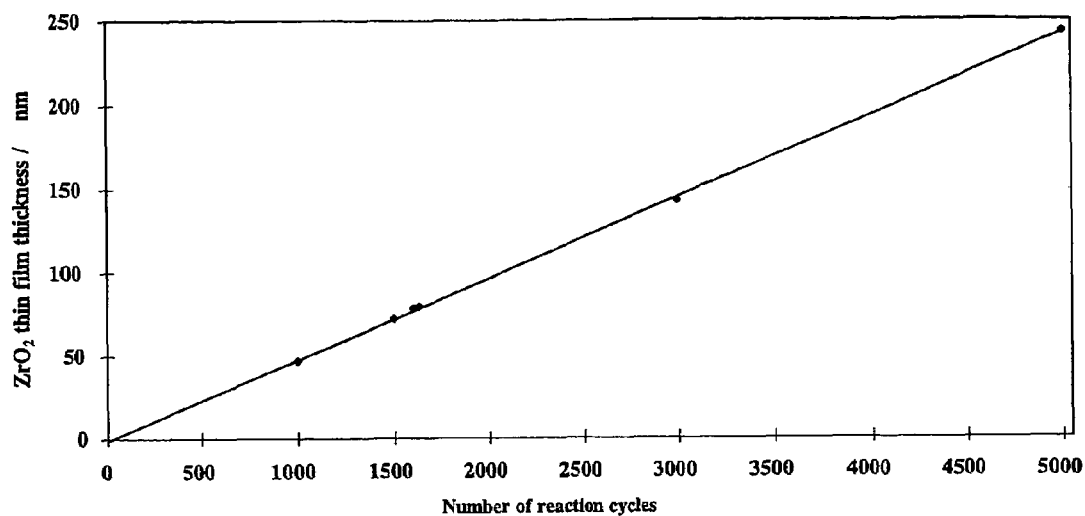
FIG. 6 presents the thickness of the $ZrO_2$ film as a function of the number of reaction cycles.

In FIG. 6 the thickness of a $ZrO_2$ thin film in nm is presented as a function of the number of reaction cycles. The film was deposited at 300° C., the temperature of the source material $CP_2ZrCl_2$ was 140-150° C. The pulse times were 0.8 s for $Cp_2ZrCl_2$ and 3.0 $O_3$. The purging after each source material pulse lasted 1.0 s. It can be seen from FIG. 6 that the thickness of the film is linearly dependent on the number of growth cycles.

XRF was used to analyse possible Cl residues present in the $ZrO_2$ thin films. In the thin films grown on a silicon or glass substrate at 250-275° C., approximately 0.1 wt-% of Cl was present. The thin films grown at 300-325° C. exhibited a chlorine content of approximately 0.06-0.07 wt-%. For films grown at temperatures higher than 325° C. chloride was not detected, i.e., the chlorine content was under the detection limit, i.e., approximately 0.02 wt-% or less.

Figure 7:
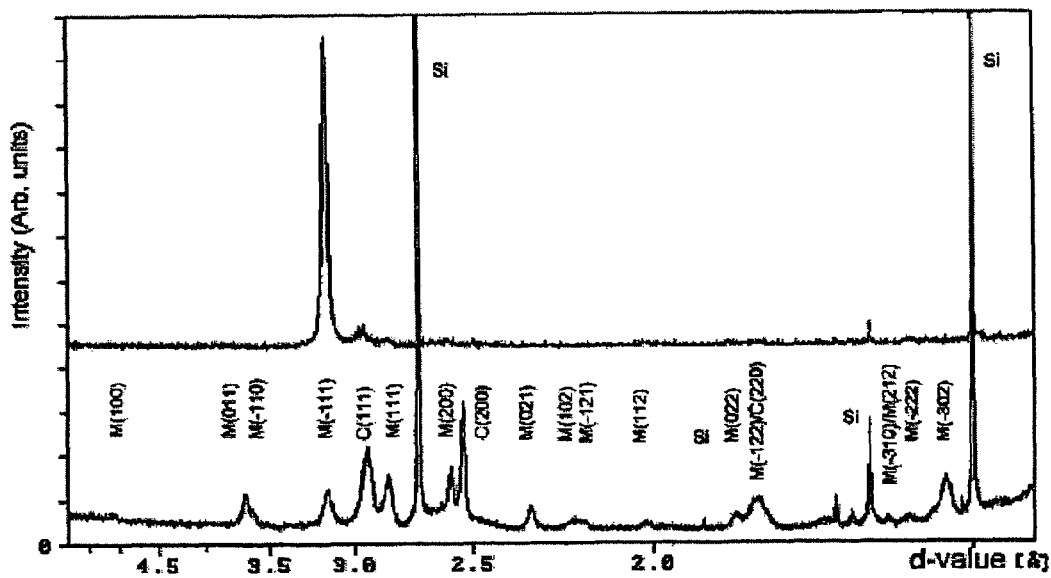
FIG. 7 presents the X-ray diffraction (XRD) patterns of $ZrO_2$ thin films grown at 300° C. and 450° C.

XRD was used to analyse the $ZrO_2$ films grown at different temperatures. The $ZrO_2$ thin films grown on silicon or glass substrate at temperatures below 300° C. were almost amorphous. Only very weak peaks, which could be interpreted as reflections of monoclinic $ZrO_2$ were shown in the film grown at 275° C. In the film grown at 300° C. the peaks could be identified as reflections of monoclinic or cubic $ZrO_2$ phase. When the growth temperature was up to 450° C., the monoclinic (−111) reflection was even stronger. The XRD patterns for the films grown at 300° C. and 450° C. on a silicon substrate are presented in FIG. 7. The pattern for the film grown at 300° C. is the one below. The thicknesses of films grown at 300° C. and 450° C. are 120 and 90 nm, respectively. The abbreviations used in the identification of the phases are as follows: M=monoclinic, C=cubic. The identification was according to JCPDS cards 36-420 and 27-997 (Joint Committee on Powder Diffraction Standards (JCPDS), 1990).

Example 3

The Preparation and Analysis of Yttrium-Stabilised Zirconium Oxide Thin Films

YSZ thin films were grown at a temperature of 300° C. with different pulsing programmes. In each pulsing programme the number of pulsing sequences consisting of $Y(thd)_3$-pulse/purge/$O_3$-pulse/purge was varied with relation to the number of pulsing sequences consisting of $CP_2ZrCl_2$-pulse/purge/$O_3$-pulse/purge.

The quality or the growth rate of the thin film did not depend on the choice of the metal source material first deposited on the surface of the substrate.

The growth rate of the yttrium-stabilised zirconium oxide was dependent on the Y/Zr pulsing ratio. If the growth rate of YSZ is compared with the summed growth rates of separate oxides, it is noticed that the at a pulsing ratio of 1:1, the growth rate is approximately 25% greater than the value calculated from the growth rates of separate oxides. When the number of yttrium pulsing sequences is increased, i.e., when the yttrium content in the thin film increases, the growth rate approaches the calculated value. This can also be concluded from FIG. 9.

Figure 10:
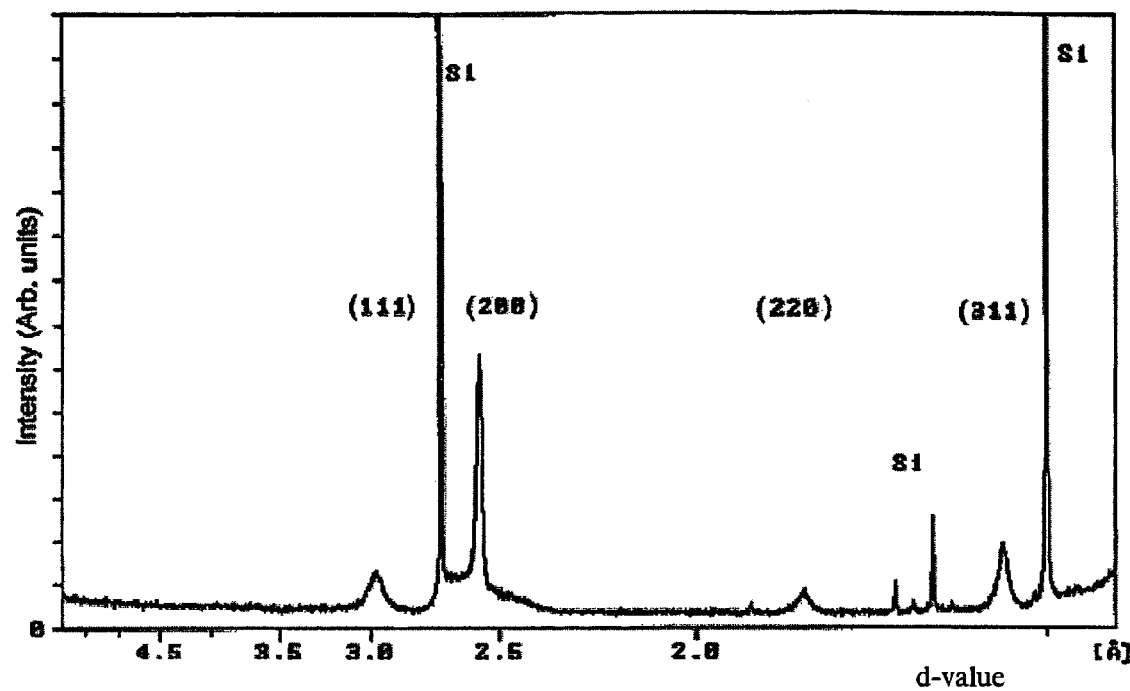
FIG. 10 presents the XRD pattern of a YSZ thin film (thickness 90 nm) grown on a (100) silicon substrate.
Figure 11:
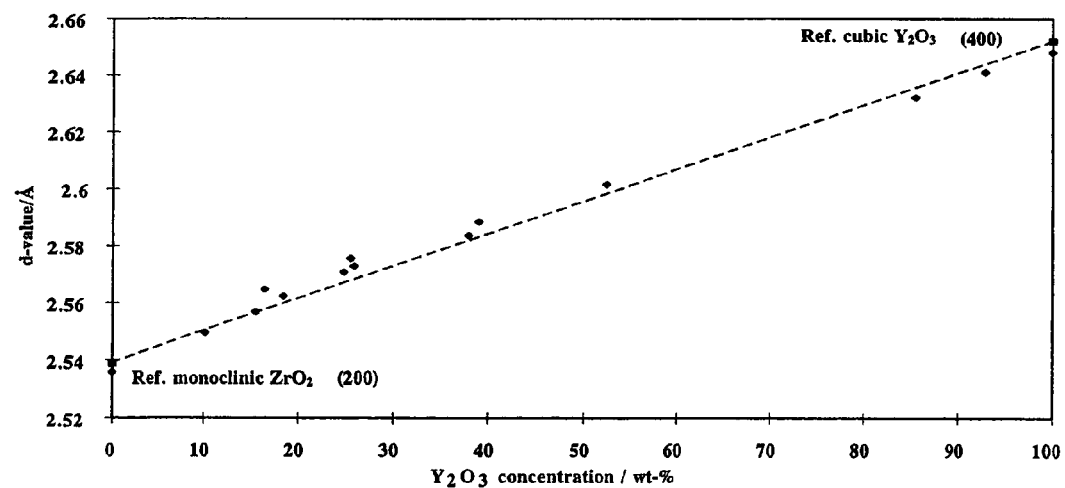
FIG. 11 presents the change of the d-value (interplanar spacing) of the (200) plane in the XRD pattern of a YSZ film as a function of $Y_2O_3$ concentration.

The YSZ films grown at 300° C. were cubic, mainly (100) oriented, but, as FIG. 10 shows, also (111), (220) and (311) reflections were detected. FIG. 10 discloses an XRD pattern for a YSZ thin film of a thickness 90 nm. The film was grown on a (100) silicon substrate at 300° C. The Y/Zr pulsing ratio was 1:1. The phase is identified according to JCPDS-card 30-1468. The position of peaks in the XRD pattern change as a function of the concentration of yttrium, since the size of the unit cell changes. The JCPDS reference value (card 30-1468) for the (200) reflection of $Y_{0.15}Zr_{0.85}O_{1.93}$ is d=2.571 Å. FIG. 11 shows how the (200) peak in the XRD pattern of a YSZ thin film changes as the $Y_2O_3/ZrO_2$ ratio is changed. The dashed line in FIG. 11 is a reference line drawn via the d-values of pure oxides obtained from literature.

Figure 12:
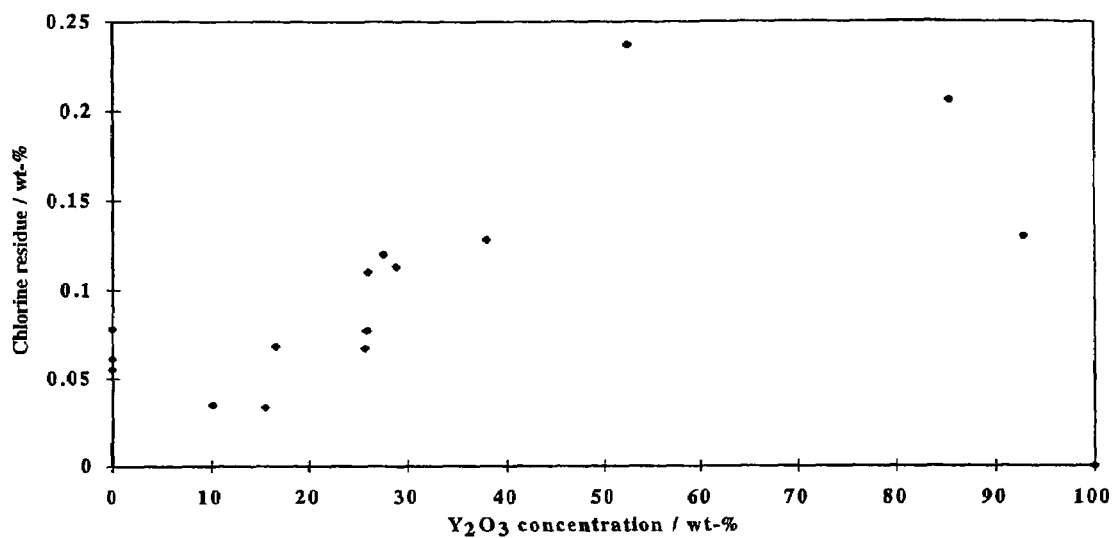
FIG. 12 presents the chloride concentration in a YSZ thin film as a function of the concentration of $Y_2O_3$.

The chlorine content of the YSZ films grown at 300° C. was analysed with XRF. At low concentrations of Y the amount of Cl in the films seemed to be slightly lower than in the films consisting essentially of $ZrO_2$. In the range 20-50 wt-% of $Y_2O_3$ in the thin film the increase in the amount of yttrium in the film resulted in an increase of the amount of Cl incorporated in the film. This can also be seen in FIG. 12. The highest concentration of chlorine (0.23 wt-%) in the YSZ thin film was detected when the yttrium oxide concentration was 50 wt-%.

Figure 13:
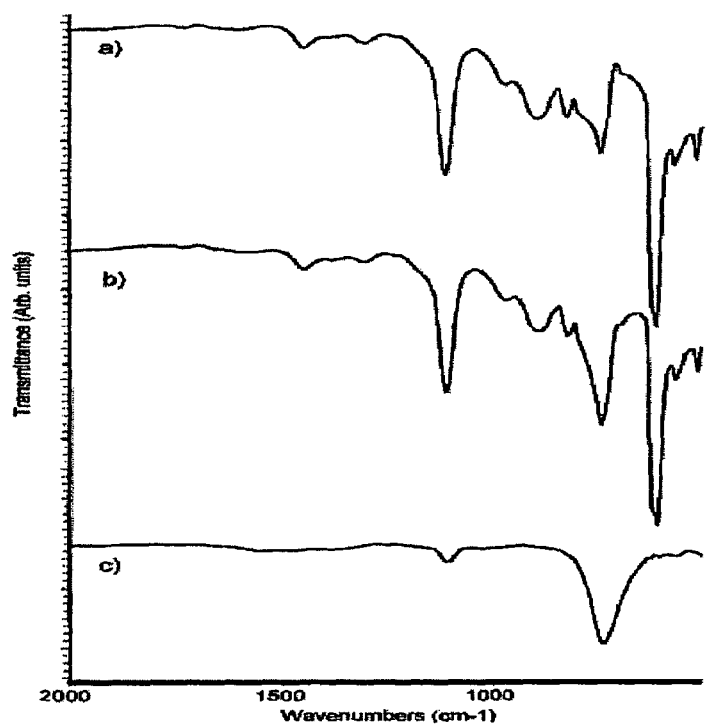
FIG. 13 presents IR-spectra of (100) silicon substrate (a), YSZ thin film (10 wt-% of $Y_2O_3$, thickness 120 nm, b) and a subtracted spectrum (c).
Figure 14:
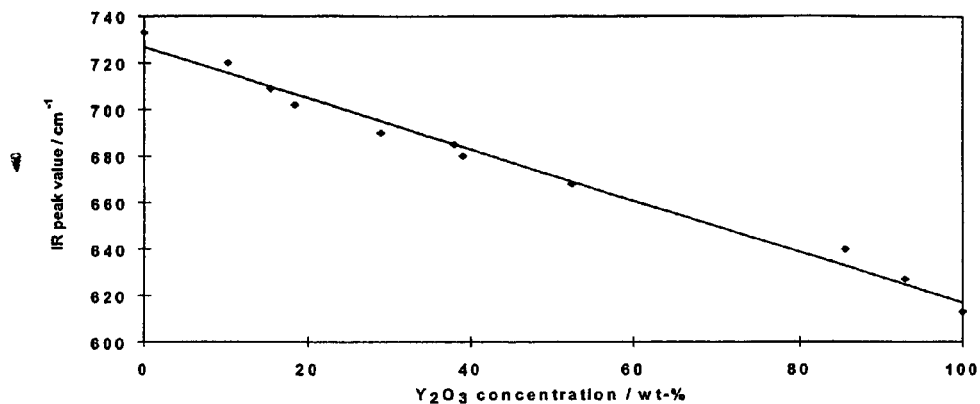
FIG. 14 presents the dependency of the wavenumber in the mid-IR-area on the concentration of $Y_2O_3$.

The IR-spectra measured for the YSZ films in the mid-IR-area mostly showed only the peaks resulting from the silicon substrate at different wave numbers. The actual peaks resulting from the YSZ film could be detected by subtracting the IR-spectra of the Si-substrate (cf. FIG. 13). In the subtracting, the peak due to Si—O bond at 1100 cm$^{-1}$ did not completely disappear. FIG. 14 shows how a distinct shift to higher wave numbers can be detected in the analysed films as the concentration of yttrium decreases. The reference value of $Y_2O_3$ absorption is 613 cm$^{-1}$.

Figure 15:
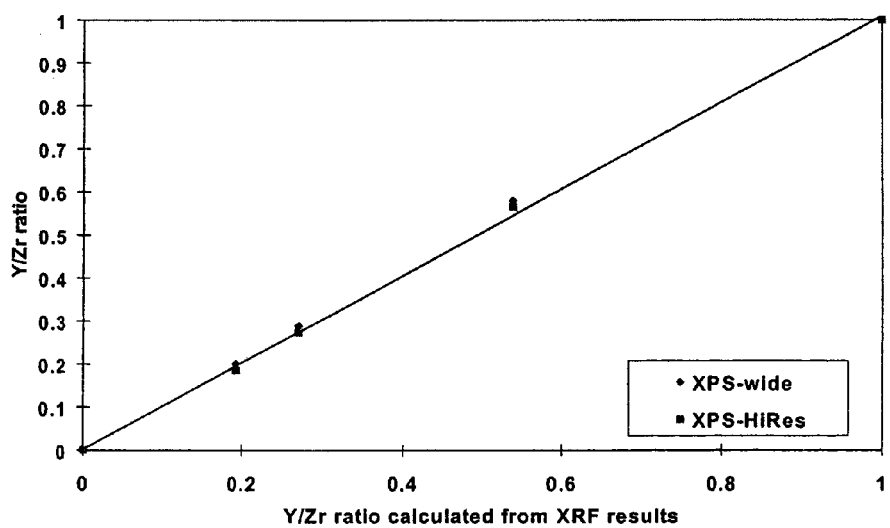
FIG. 15 presents the Y/Zr ratio measured with different analysis methods.

A series of grown $Y_2O_3$, $ZrO_2$ and YSZ films was analysed with X-ray photoelectron spectroscopy (XPS). The contents of $Y_2O_3$ in the samples were 0, 3, 10, 30 or 100 wt-%. Small amounts of carbon and oxygen ($CO_2$) were detected on the surface. This is typical for samples handled in air. The spectra measured from the surface was used to calculate the atom compositions on the surface, and the atom ratio Y/Zr which was compared with the results obtained from X-ray fluorescence (XRF) measurements. This comparison is presented in FIG. 15, wherein the $Y_2O_3/ZrO_2$ ratio calculated from XRF results is in the x-axis and the Y/Zr ratio according to the XPS results is in the y-axis. The line is drawn based on the XPS-HiRes measurements.

What is claimed is:

1. A method for producing an yttrium oxide thin film on a substrate in a reaction space by an atomic layer deposition (ALD)-type process, said method comprising:
    multiple self-limiting deposition cycles, each cycle comprising alternately feeding into the reaction space vapor phase pulses of an yttrium source material and an oxygen source material, wherein the yttrium source material is a cyclopentadienyl compound or a derivative of a cyclopentadienyl compound, and wherein the yttrium oxide thin film is grown at a temperature of 200 to 400° C.

2. The method of claim 1, wherein the yttrium oxide thin film is grown at 250-350° C.

3. The method of claim 1 wherein alternately feeding into the reaction space vapor phase pulses of an yttrium metal source material and an oxygen source material comprises:
    feeding into the reaction space a vapor-phase pulse of the yttrium source material, wherein the vapor-phase pulse further comprises an inert carrier gas;
    purging the reaction space with an inert gas;
    feeding a vapor-phase pulse of the oxygen source material into the reaction space; and
    purging the reaction space with an inert gas.

4. The method of claim 1, wherein the yttrium source material is selected from the group of compounds having the general formula (I) or (II):

$YX_3$ (I)

$YX_3B$ (II)

wherein
    X is selected from the group consisting of cyclopentadienyl, and derivatives of cyclopentadienyl, and
    B is a neutral adduct ligand.

5. The method of claim 4, wherein B is selected from the group consisting of a hydrocarbon, an oxygen-containing hydrocarbon, and a nitrogen-containing hydrocarbon.

6. The method of claim 5, wherein B is an oxygen containing hydrocarbon and the oxygen-containing hydrocarbon is an ether.

7. The method of claim 5, wherein B is a nitrogen-containing hydrocarbon selected from the group consisting of bipyridine, phenanthroline, an amine, and a polyamine.

8. The method of claim 4, wherein X is a derivative of cyclopentadienyl having the general formula (IV):

$$C_5H_{5-y}R'''_y \qquad (IV)$$

wherein
R''' is selected from the group consisting of a linear or branched $C_1$-$C_{10}$ alkyl group, an alkoxy group, an aryl group, an amino group, a cyano group, and a silyl group and
y is an integer 1-5.

9. The method of claim 1, wherein the yttrium source material is Y(cot)Cp*.

10. The method of claim 1, wherein the oxygen source material is selected from the group consisting of water, oxygen, hydrogen peroxide, aqueous solution of hydrogen peroxide, ozone, oxides of nitrogen, halide-oxygen compounds, peracids (—O—O—H), alcohols, alkoxides, various oxygen-containing radicals and mixtures thereof.

11. The method of claim 1, wherein the oxygen source material is water.

12. The method of claim 1, additionally comprising alternately feeding into the reaction space vapor phase pulses of a zirconium source material and an oxygen source material.

13. The method of claim 12, wherein a yttrium-stabilized zirconium oxide thin film is formed on the substrate.

14. A method for producing an yttrium oxide thin film on a substrate in a reaction space by an atomic layer deposition (ALD)-type process, said method comprising:
alternately feeding into said reaction space vapor phase pulses of an yttrium cyclopentadienyl compound and water in multiple deposition cycles wherein the deposition rate is essentially constant in an atomic layer deposition (ALD) temperature window.

15. The method of claim 14, wherein the ALD temperature window is from 250° C. to 350° C.

16. An atomic layer deposition (ALD) process for depositing yttrium oxide thin films on a substrate in a reaction space comprising the steps of:
a) feeding a vapor-phase pulse of an yttrium source chemical into the reaction space, such that the yttrium source material adsorbs to the substrate in a self-limiting manner, the yttrium source chemical being a cyclopentadienyl compound or derivative of a cyclopentadienyl compound;
b) removing unreacted vapor phase yttrium source chemical from the reaction space;
c) feeding a vapor-phase pulse of an oxygen source chemical into the reaction space to react with the adsorbed yttrium source material in a self-limiting surface reaction;
d) removing unreacted oxygen source chemical from the reaction space; and
e) repeating steps a) through d) to deposit an yttrium oxide thin film of a desired thickness, and wherein the yttrium oxide thin films are deposited at a temperature of 200 to 400° C.

17. The process of claim 16, wherein the oxygen source chemical is water.

* * * * *